(12) United States Patent
Xia

(10) Patent No.: US 10,886,941 B2
(45) Date of Patent: Jan. 5, 2021

(54) PULSE DENSITY MODULATION METHOD AND PULSE DENSITY VALUE SIGNAL CONVERSION CIRCUIT

(71) Applicant: HANGZHOU QISU TECHNOLOGY CO., LTD., Hangzhou (CN)

(72) Inventor: Nan Xia, Shaoxing (CN)

(73) Assignee: HANGZHOU QISU TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 16/499,315

(22) PCT Filed: Mar. 27, 2018

(86) PCT No.: PCT/CN2018/080670
§ 371 (c)(1),
(2) Date: Sep. 29, 2019

(87) PCT Pub. No.: WO2018/177285
PCT Pub. Date: Oct. 4, 2018

(65) Prior Publication Data
US 2020/0382132 A1     Dec. 3, 2020

(30) Foreign Application Priority Data
Mar. 30, 2017    (CN) .......................... 2017 1 0204067

(51) Int. Cl.
*H03M 7/00*     (2006.01)
*H03M 7/04*     (2006.01)
(Continued)

(52) U.S. Cl.
CPC ................ *H03M 7/04* (2013.01); *H03K 5/04* (2013.01); *H03K 5/15013* (2013.01);
(Continued)

(58) Field of Classification Search
None
See application file for complete search history.

(56) References Cited

U.S. PATENT DOCUMENTS 5,059,979 A * 10/1991 Micic ...................... H03L 7/189
341/152
5,995,546 A * 11/1999 Richardson ........... G06F 7/5095
341/144
(Continued)

FOREIGN PATENT DOCUMENTS

CN      1233112 A    10/1999
CN    101252397 A    8/2008
(Continued)

*Primary Examiner* — Tuan T Lam
(74) *Attorney, Agent, or Firm* — Bayramoglu Law Offices LLC

(57) ABSTRACT

A pulse density modulation method includes the following steps: S01, obtaining a number of bits n of a binary density value d, setting a number of bits of a counter as n, an initial value of the counter is 0 or 1; S02, searching for a rightmost 1: obtaining a number of bits j of the rightmost 1 of a current value i of the counter counted from right to left; a number in the counter is a binary number; a minimum value of j is 1; S03, determining whether corresponding bits are equal; S04, adding the value i of the counter by 1, proceeding to a next period, and turning to the step S02.

12 Claims, 4 Drawing Sheets

(51) Int. Cl.
*H03M 3/00* (2006.01)
*H03K 23/00* (2006.01)
*H03K 5/04* (2006.01)
*H03K 5/15* (2006.01)

(52) U.S. Cl.
CPC .......... *H03K 23/005* (2013.01); *H03M 3/376* (2013.01); *H03M 3/50* (2013.01)

(56) References Cited

U.S. PATENT DOCUMENTS

| | | | | |
|---|---|---|---|---|
| 6,009,007 | A * | 12/1999 | Pan | H02M 7/53871 |
| | | | | 363/98 |
| 6,317,457 | B1 * | 11/2001 | Naruse | H04B 14/02 |
| | | | | 375/237 |
| 6,563,393 | B2 * | 5/2003 | Zhang | H03M 7/00 |
| | | | | 332/106 |
| 7,183,959 | B1 * | 2/2007 | Dickey | H03M 1/48 |
| | | | | 341/152 |
| 2015/0295619 | A1 * | 10/2015 | Petrovic | H04L 27/04 |
| | | | | 375/130 |
| 2018/0234064 | A1 * | 8/2018 | Gustavsson | H04R 1/04 |
| 2019/0165775 | A1 * | 5/2019 | Costa | H03K 7/08 |
| 2019/0259402 | A1 * | 8/2019 | Farshbaf Zinati | H03F 3/2171 |

FOREIGN PATENT DOCUMENTS

| | | |
|---|---|---|
| CN | 102195622 A | 9/2011 |
| CN | 102282769 A | 12/2011 |
| CN | 106505977 A | 3/2017 |
| CN | 106849955 A | 6/2017 |
| CN | 206712774 U | 12/2017 |

* cited by examiner

PULSE DENSITY MODULATION METHOD AND PULSE DENSITY VALUE SIGNAL CONVERSION CIRCUIT

CROSS REFERENCE TO THE RELATED APPLICATIONS

This application is the national phase entry of International Application No. PCT/CN2018/080670, filed on Mar. 27, 2018, which is based upon and claims priority to Chinese Patent Application No. 201710204067.0, filed on Mar. 30, 2017, the entire contents of which are incorporated herein by reference.

TECHNICAL FIELD

The present disclosure relates to the technical field of digital signal processing, more specifically relates to a pulse density modulation method and a pulse density value signal conversion circuit for a DC-DC converter or a digital-to-analog converter.

BACKGROUND

Pulse signals have three basic properties: amplitude, width, and density. The modulation is a process of causing at least one property of a pulse signal to change within an expected rule. A signal obtained after the modulation is called a pulse modulation signal.

The conventional modulation methods include: pulse amplitude modulation (PAM), pulse width modulation (PWM), and pulse density modulation (PDM). The latter two modulation methods are commonly used, in that an amplitude of a signal is easily susceptible to an external interference.

In DC-DC converters and digital-to-analog converters, an output voltage can be controlled by controlling a pulse of a control signal, and the most commonly used modulation is the pulse width modulation. The pulse width modulation is readily controlled, but the waveform is not uniform. The waveform of the pulse density modulation is much more uniform than that of the pulse width modulation, but the control of the pulse density modulation is more complicated.

The existing pulse density modulation method has a defect of nonuniform fluctuation waveform.

China National Intellectual Property Administration disclosed a patent document entitled "Pulse Density Modulation Method and Apparatus" on Sep. 21, 2011 (Publication No: 102195622A), wherein the pulse density modulation (PDM) driver outputs a PDM stream and can be switched to a control token, and the switch is performed when a first integral of the PDM stream has a magnitude less than or equal to a first predetermined value and a second integral of the PDM stream has a magnitude less than or equal to a second predetermined value. The solution still has the defects of a complicated control process and a cumbersome related circuit, etc.

SUMMARY

The present disclosure mainly solves the technical problem of the nonuniform output waveform existing in the prior art, and the present disclosure provides a pulse density modulation method and a pulse density value signal conversion circuit with a relatively small waveform fluctuation of an output signal, a convenient calculation and a simple circuit structure.

The present disclosure is directed to the above technical problem and mainly achieved by the following technical solutions: a pulse density modulation method, including the following steps:

S01, obtaining a number of bits n of a binary density value d, a number of bits of a counter is set as n, an initial value of the counter is 0 or 1;

S02, searching for a rightmost 1: obtaining a number of bits j of the rightmost 1 of a current value i of the counter counted from right to left; a number in the counter is a binary number; a minimum value of j is 1;

S03, determining whether corresponding bits are equal: if the $j^{th}$ bit counted from left to right of d is 1, then a bit of the signal output in the period is 1; if the $j^{th}$ bit counted from left to right of d is 0, then a bit of the signal output in the period is 0; and S04, adding the value i of the counter by 1, proceeding to a next period, and turning to the S02.

The binary pulse signal density value is an input of the present solution, and a sequence formed by signal bits output in various periods is an output signal, which is an output of the present solution. Each binary density value d corresponds to an output signal. The first bit of the output signal is the leftmost bit.

When an initial value of i is set as 0, the number of bits of the output signal is $2^n$. When the initial value of i is 1, the number of bits of the output signal is 2n−1. In the situation, a pulse density range is 0 (i.e. $0/2^n-1$) to 1 (i.e. $2^n-1/2^n-1$), and either an output signal in which each bit is 0, or an output signal in which each bit is 1 can be generated.

After the value i of the counter reaches an upper limit, the value i of the counter returns to the initial value and the next period starts, or the process ends.

The solution is applicable to a DC-DC converter or a digital-to-analog converter, the binary density value d is an input signal of the DC-DC converter or a digital signal generated by a front end of the digital-to-analog converter, after an output signal is obtained, the DC-DC converter or the digital-to-analog converter modulates an output voltage according to the output signal.

Preferably, in the step S02, searching for the rightmost 1 is specifically as follows: an instruction in a CPU instruction set is used to directly search and obtain the number of bits j of the rightmost 1 of the current value i of the counter counted from right to left; in the step S03, determining whether the corresponding bits are equal is specifically as follows: a bit test instruction is used to check whether the $j^{th}$ bit of the density value d counted from left to right is 1.

Preferably, in the step S02, searching for the rightmost 1 is realized by a loop test from left to right or from right to left;

in the step S03, determining whether the corresponding bits are equal is specifically as follows. d is shifted j−1 bits to the left by a shift instruction and a highest bit is retained, if a result is 1, then the corresponding bits are equal, if the result is 0, then the corresponding bits are not equal; or d is shifted n−j bits to the right by the shift instruction and a lowest bit is retained, if a result is 1, then the corresponding bits are equal, if the result is 0, then the corresponding bits are not equal.

Preferably, the step S02 and the step S03 are replaced by steps S11-S14 as follows:

S11, inverting the density value d according to a bit sequence to obtain D;

S12, subtracting the value i of the counter by one, and then XORed with the original i to obtain k;

S13, adding k by 1, and shifting one bit to the right to obtain m;

S14, performing an AND operation on m and D, wherein if a result is equal to m, then a bit of a signal output in the period is 1; if the result is not equal to m, the bit of the signal output in the period is 0.

Preferably, when the initial value of i is 0, a first bit of the output signal is set as 0 or 1. Namely when the initial value of i is 0, the bit of the signal output in a first period is fixed to be 0 or fixed to be 1.

When the first bit of the output signal is set as 0, the pulse density range is 0 (i.e. $0/2^n$) to $(2^n-1)/2^n$, a signal in which each bit is 0 can be generated, and a signal in which each bit is 1 cannot be generated. When the first bit of the output signal is set as 1, the density value range is $1/2^n$ to 1 (i.e. $2^n/2^n$), and the uniformity compared with the former situation is slightly lower, an output signal in which each bit is 0 cannot be generated, but an output signal in which each bit is 1 can be generated. Users can choose according to actual needs.

In the step S12, when i is set as the initial value, every bit of the value of i−1 is 1, e.g. n=4, then i−1=1111.

The foregoing technical problem can also be solved by the following solution: a pulse density modulation method, wherein a period of a pulse signal is s, and the CO bit of an output signal is determined by the following manner:

A01, multiplying density value d with q, dividing an obtained product by s, and taking an integer part from an obtained quotient as h;

A02, determining whether h and a pulse count value are the same, if the same, the $q^{th}$ bit of the output signal is 0, if not, then proceed to the step A03; and A03, setting the $q^{th}$ bit of the output signal as 1, and setting the pulse count value as h;

wherein a number of bits of the output signal is s, i.e. a value range of q is 1 to s; an initial value of the pulse count value is 0.

A pulse density value signal conversion circuit includes a search module and a comparison module, and the search module includes a low-bit test module and a conversion module, an input terminal of the low-bit test module is connected to a counter, an output terminal of the low-bit test module is connected to the conversion module, and an output terminal of the conversion module is connected to an input terminal of the comparison module, the input terminal of the comparison module is further connected to a pulse density value signal, and an output terminal of the comparison module is an output terminal of the pulse density value signal conversion circuit; the low-bit test module includes n−1 signal lines, n count input terminals and n−2 OR gates, and the conversion module includes n−1 AND gates, n−1 NOT gates and n output terminals, wherein n is the number of bits of the counter, the signal lines are marked as s[1] to s[n−1] in sequence, the count input terminals are marked as i[1] to i[n] in sequence and are respectively connected to the $1^{st}$ to $n^{th}$ bit of the counter, and the output terminals are marked as o[1] to o[n] in sequence; the count input terminal i[1] is directly connected to the output terminal o[1] and the signal line s[1], the signal line s[1] is connected to a first input terminal of a first AND gate through a NOT gate, a second input terminal of the first AND gate is connected to the count input terminal i[2], and an output terminal of the first AND gate is connected to the output terminal o[2]; when j≥2, an output terminal of the $(j-1)^{th}$ OR gate is connected to the signal line s[j], the signal line s[j] is connected to a first input terminal of the $j^{th}$ AND gate through a NOT gate, a second input terminal of the $j^{th}$ AND gate is connected to the count input terminal i[j+1]; a first input terminal of the $(j-1)^{th}$ OR gate is connected to the output terminal o[j], and a second input terminal of the $(j-1)^{th}$ OR gate is connected to the signal line s[j−1].

Preferably, the comparison module includes n pulse density value input terminals, n AND gates, and an OR gate having n input terminals, the pulse density value input terminals are marked as d[1] to d[n] in sequence and are respectively connected to the 1st bit to the $n^{th}$ bit of the pulse density value signal;

a first input terminal of the $k^{th}$ AND gate is connected to the output terminal o[k] of the search module, a second input terminal of the $k^{th}$ AND gate is connected to the input terminal d[n+1−k] of the pulse density value, an output terminal of the $k^{th}$ AND gate is connected to the $k^{th}$ input terminal of the OR gate having n input terminals; an output of the OR gate having n input terminals is a total output terminal of the pulse signal conversion circuit.

A pulse density value signal conversion circuit includes a search module and a comparison module, and the search module includes a low-bit test module and a conversion module, an input terminal of the low-bit test module is connected to a counter, an output terminal of the low-bit test module is connected to the conversion module, and an output terminal of the conversion module is connected to an input terminal of the comparison module, the input terminal of the comparison module is further connected to a pulse density value signal, and an output terminal of the comparison module is an output terminal of the pulse density value signal conversion circuit; the low-bit test module includes n−1 signal lines, n count input terminals and n−2 OR gates, and the conversion module includes n−1 AND gates, n−1 NOT gates and n output terminals, wherein n is the number of bits of the counter, the signal lines are marked as s[1] to s[n−1] in sequence, the count input terminals are marked as i[1] to i[n] in sequence and are respectively connected to the $1^{st}$ to the $n^{th}$ bit of the counter, and the output terminals are marked as o[1] to o[n] in sequence; the count input terminal i[1] is directly connected to the output terminal o[1] and the signal line s[1], the signal line s[1] is connected to a first input terminal of a first AND gate through a NOT gate, a second input terminal of the first AND gate is connected to the count input terminal i[2], and an output terminal of the first AND gate is connected to the output terminal o[2];

when j≥2, an output terminal of the $(j-1)^{th}$ OR gate is connected to the signal line s[j], the signal line s[j] is connected to a first input terminal of the $j^{th}$ AND gate through a NOT gate, a second input terminal of the $j^{th}$ AND gate is connected to the count input terminal i[j+1]; a first input terminal of the $(j-1)^{th}$ OR gate is connected to the count input terminal i[j], and a second input terminal of the $(j-1)^{th}$ OR gate is connected to the signal line s[j−1].

Preferably, the comparison module includes n pulse density value input terminals, n AND gates, and an OR gate having n input terminals, the pulse density value input terminals are marked as d[1] to d[n] in sequence and are respectively connected to the $1^{st}$ bit to the $n^{th}$ bit of the pulse density value signal;

a first input terminal of the $k^{th}$ AND gate is connected to the output terminal o[k] of the search module, a second input terminal of the $k^{th}$ AND gate is connected to the pulse density value input terminal d[n+1−k], an output terminal of the $k^{th}$ AND gate is connected to the $k^{th}$ input terminal of the OR gate having n input terminals; an output of the OR gate having n input terminals is a total output terminal of the pulse density value signal conversion circuit.

A pulse density value signal conversion circuit includes a search module and a comparison module, and the search module includes a low-bit test module and a conversion module, an input terminal of the low-bit test module is connected to a counter, an output terminal of the low-bit test module is connected to the conversion module, and an output terminal of the conversion module is connected to an input terminal of the comparison module, the input terminal of the comparison module is further connected to a pulse density value signal, and an output terminal of the comparison module is an output terminal of the pulse density value signal conversion circuit; the low-bit test module includes n−1 signal lines, n count input terminals and n−2 OR gates, and the conversion module includes n−1 AND gates, n−1 NOT gates and n output terminals, wherein n is the number of bits of the counter, the signal lines are marked as s[1] to s[n−1] in sequence, the count input terminals are marked as i[1] to i[n] in sequence and are respectively connected to the $1^{st}$ bit to the $n^{th}$ bit of the counter, and the output terminals are marked as o[1] to o[n] in sequence; the $j^{th}$ OR gate has j+1 input terminals;

the count input terminal i[1] is directly connected to the output terminal o[1] and the signal line s[1], the signal line s[1] is connected to a first input terminal of a first AND gate through a NOT gate, a second input terminal of the first AND gate is connected to the count input terminal i[2], and an output terminal of the first AND gate is connected to the output terminal o[2];

when j≥2, an output terminal of the $(j−1)^{th}$ OR gate is connected to the signal line s[j], the signal line s[j] is connected to a first input terminal of the $j^{th}$ AND gate through a NOT gate, a second input terminal of the $j^{th}$ AND gate is connected to the count input terminal i[j+1]; the $g^{th}$ input terminal of the $(j−1)^{th}$ OR gate is connected to the count input terminal i[g].

Preferably, the comparison module includes n pulse density value input terminals, n AND gates, and an OR gate having n input terminals, the pulse density value input terminals are marked as d[1] to d[n] in sequence and respectively connected to the $1^{st}$ bit to the $n^{th}$ bit of the pulse signal density value;

a first input terminal of the $k^{th}$ AND gate is connected to the output terminal o[k] of the search module, a second input terminal of the $k^{th}$ AND gate is connected to the signal input terminal d[n+1−k], an output terminal of the $k^{th}$ AND gate is connected to the $k^{th}$ input terminal of the OR gate having n input terminals; an output of the OR gate having n input terminals is a total output terminal of the pulse signal conversion circuit.

The present solution is used for converting a pulse density value signal to obtain a pulse density value signal with a preferable uniformity. The input of the present solution is a binary signal representing the pulse density value, and the output is a pulse signal after a density modulation, the current converted sequence number is stored in the counter, and the sequence number is added by 1 for each conversion.

The function of the search module is to find a position of the lowest-bit 1 of the counter i, and then zero clearing is performed on all except the bit; the low-bit test module detects whether there is 1 on each bit lower than it, and an output of the OR gate is caused by the conversion module to pass through the NOT gate and is input to the AND gate together with i to obtain an output o, and an output signal is finally obtained by a comparison using the comparison module.

The substantial effect brought by the present disclosure is that the original continuous long pulse is split into a plurality of short pulses, so as to make the waveform fluctuation of the output signal smaller, and reduce the impact on the circuit. The output signal is calculated by a hardware instead of a software, which enables a higher control accuracy without affecting the system calculation. In addition, the hardware circuit structure is simple, which can be realized by only a small number of gate circuits, and the cost is extremely low.

DETAILED DESCRIPTION OF THE EMBODIMENTS

The technical solutions of the present disclosure will be further specifically described hereinafter with reference to the embodiments and drawings.

Figure 1:
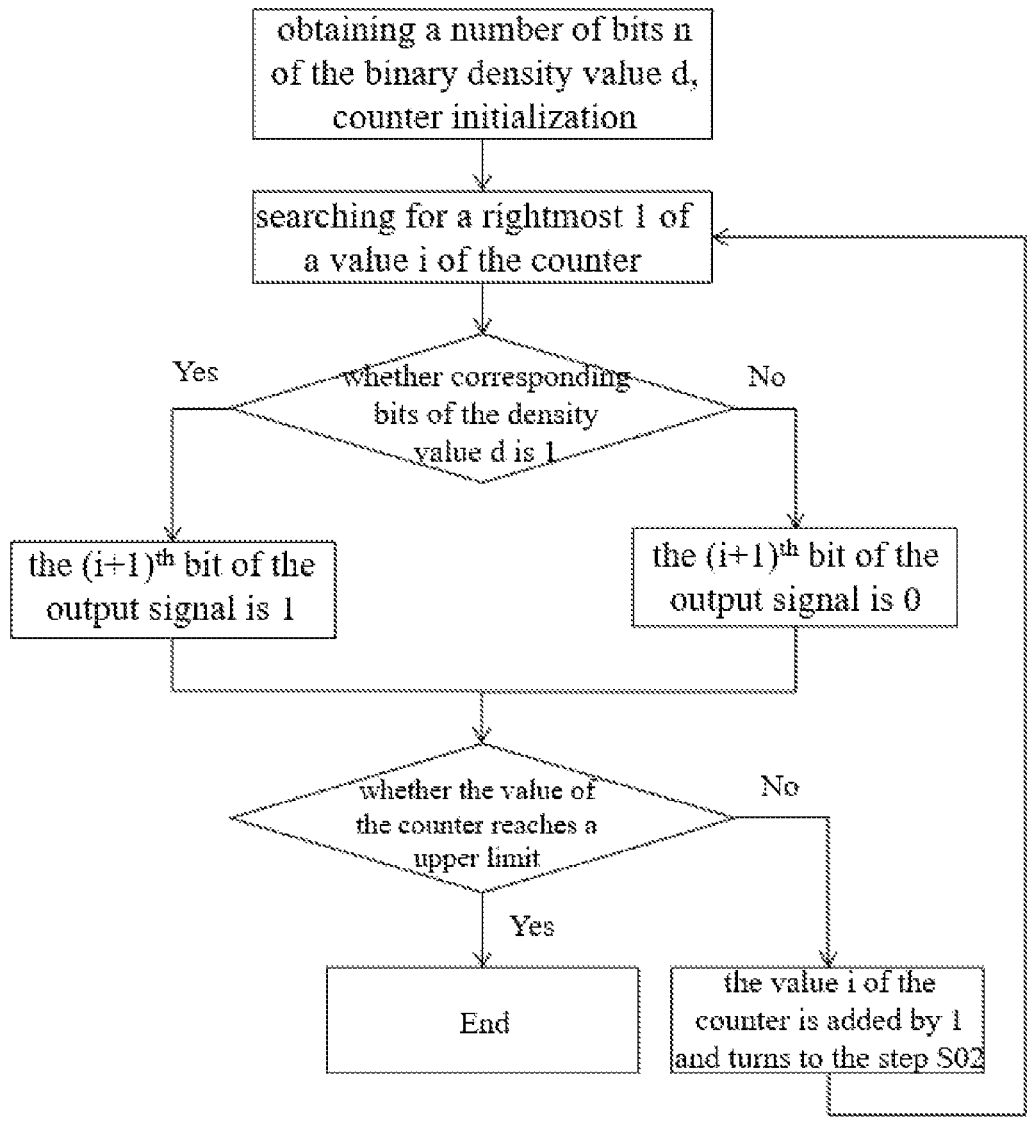
FIG. 1 is a flow chart of the present disclosure.

Embodiment 1: a pulse density modulation method of the present embodiment, as shown in FIG. 1, includes the following steps of:

S01, obtaining a number of bits n of a binary density value d, and setting a number of bits of a counter as n, wherein an initial value of the counter is 0 or 1; a number in the counter is a binary number;

S02, searching for the rightmost 1: obtaining a number of bits j of a rightmost 1 of a current value i of the counter counted from right to left; wherein the minimum value of j is 1;

S03, determining whether corresponding bits are equal: if the $j^{th}$ bit of d counted from left to right is 1, then a bit of a signal output in the period is 1; if the $j^{th}$ bit of d counted from left to right is 0, then a bit of the signal output in the period is 0;

S04, adding the value i of the counter by 1, proceeding to a next period, and turning to the step S02.

A sequence formed by bits of signals output in various periods is an output signal, which is an output of the present solution. Each binary density value d corresponds to an output signal. The first bit of the output signal is the leftmost bit.

When the initial value of i is set as 0, the number of bits of the output signal is $2^n$. When the initial value of i is 1, the number of bits of the output signal is $2^n-1$. In the situation, a pulse density range is 0 (i.e. $0/2^n-1$) to 1 (i.e. $2^n-1/2^n-1$), and either an output signal in which each bit is 0, or an output signal in which each bit is 1 can be generated.

After the value i of the counter reaches an upper limit, the counter returns to the initial value and a next period starts, or the process ends.

The solution is applicable to a DC-DC converter or a digital-to-analog converter, the binary density value d is an input signal of the DC-DC converter or a digital signal generated by a front end of the digital-to-analog converter, after an output signal is obtained, the DC-DC converter or the digital-to-analog converter modulates an output voltage according to the output signal.

The solution is mainly applicable to voltage control. For example, the DC-DC converter can control the output voltage by controlling a control signal duty cycle of a switch tube, and PWM is the most commonly employed of all the control methods, for example, the control signal is 11110000, which will become a dispersed 10101010 or other signal by using the present method, so that the fluctuation of the output voltage will be smaller.

In the step S02, searching for the rightmost 1 is specifically as follows. An instruction in a CPU instruction set is used to directly search and obtain a number of bits j of the rightmost 1 of a current value i of the counter counted from right to left; in the step S03, determining whether the corresponding bits are equal is specifically as follows. A bit test instruction is used to check whether the $j^{th}$ bit of the density value d counted from left to right is 1.

For example, the binary density valued is 0011 (2 in decimal), the number of bits n is 4, the number of bits of the counter is set as 4, the initial value is 0, the rightmost 1 cannot be searched, the $1^{st}$ (i=0, i+1=1, wherein i is converted to decimal calculation) bit of the output signal is 0, and turning to the step S05, the value i of the counter is added by 1 to 0001 (1 in decimal), the number of bits counted from right to left of the rightmost 1 is 1, and the first bit counted from left to right of the density value d is 0, then the $2^{nd}$ (i+1=2) bit of the output signal is 0; the value i of the counter is further added by 1 and turns to the step S02. It can be seen from the calculation that the $1^{st}$ bit, the $2^{nd}$ bit, the $3^{rd}$ bit and the $4^{th}$ bit of the output signal are all 0. When calculating the $5^{th}$ bit, i is 0100 (4 in decimal), the rightmost 1 is the $3^{rd}$ bit (j=3), the $3^{rd}$ bit of the density value d is also 1, and then the $5^{th}$ bit of the output signal is 1. Finally, an output signal of 0000 1000 0000 1000 is obtained when the binary density value d is 0011. Compared with pulse modulation (output signal is 1100 0000 0000 0000) or traditional density modulation, the output signal of the present solution has small fluctuation and good uniformity.

When the initial value of i is 0, the $1^{st}$ bit of the output signal is set as 0 or 1. Namely, when the initial value of i is 0, the bit of the signal output in the first period is fixed to be 0 or fixed to be 1.

When the $1^{st}$ bit of each output signal is set as 0, the density value range is 0 (i.e. $0/2^n$) to $(2^n-1)/2^n$, a signal in which each bit is 0 can be generated, and a signal in which each bit is 1 cannot be generated. When the $1^{st}$ bit of each output signal is set as 1, the density value range is 1/2n to 1 (i.e. $2^n/2^n$), the uniformity will be slightly lower than that in the former situation, and an output signal in which each bit is 0 cannot be generated, but an output signal in which each bit is 1 can be generated. Users can choose according to actual needs.

In the step S12, when i is set to the initial value, each bit of the value of i−1 is 1, e.g. n=4, then i−1=1111.

n=4, the initial value of i is 0, when the $1^{st}$ bit of the output signal is set as 0, according to different density values, the output signals are arranged in sequence as follows:
0000 0000 0000 0000 Description: density value 0000 has no 1, therefore the output is all 0;
0000 0000 1000 0000 Description: density value 0001, the $9^{th}$ bit of the output signal is 1, the value of the counter is 1000, the rightmost 1 is the $4^{th}$ bit counted from right to left, the $4^{th}$ bit counted from left to right of the density value is also 1, so the $9^{th}$ bit is 1, and other bits do not accord with the requirement, therefore are 0;
0000 1000 0000 1000 Description: density value 0010, the $5^{th}$ bit and the $13^{th}$ bit of the output signal are 1, the values of the counter are 0100 and 1100 respectively, their rightmost 1 are both the $3^{rd}$ bit, and the $3^{rd}$ bit counted from left to right of the density value is 1, therefore these two bits output 1;
0000 1000 1000 1000 Description: density value 0011, the rest can be done in the same manner;
0010 0010 0010 0010
0010 0010 1010 0010
0010 1010 0010 1010
0010 1010 1010 1010
0101 0101 0101 0101
0101 0101 1101 0101
0101 1101 0101 1101
0101 1101 1101 1101
0111 0111 0111 0111
0111 0111 1111 0111
0111 1111 0111 1111
0111 1111 1111 1111 n=4, the initial value of i is 0, when the $1^{st}$ bit of the output signal is set as 1, the output signals are in sequence as follows:
1000 0000 0000 0000
1000 0000 1000 0000
1000 1000 0000 1000
1000 1000 1000 1000
1010 0010 0010 0010
1010 0010 1010 0010
1010 1010 0010 1010
1010 1010 1010 1010
1101 0101 0101 0101
1101 0101 1101 0101
1101 1101 0101 1101
1101 1101 1101 1101
1111 0111 0111 0111
1111 0111 1111 0111
1111 1111 0111 1111
1111 1111 1111 1111;

n=4, when the initial value of i is 1, the output signals are in sequence as follows:
000 0000 0000 0000
000 0000 1000 0000
000 1000 0000 1000
000 1000 1000 1000
010 0010 0010 0010
010 0010 1010 0010
010 1010 0010 1010
010 1010 1010 1010
101 0101 0101 0101
101 0101 1101 0101
101 1101 0101 1101
101 1101 1101 1101
111 0111 0111 0111
111 0111 1111 0111
111 1111 0111 1111
111 1111 1111 1111.

Embodiment 2: a pulse density modulation method of the present embodiment includes the following steps of:

S01, obtaining a number of bits n of a binary density value d, setting a number of bits of a counter as n, wherein an initial value of the counter is 0 or 1;

S02, searching for the rightmost 1: obtaining a number of bits j of the rightmost 1 of a current value i of the counter counted from right to left;

S03, determining whether corresponding bits are equal: if the $j^{th}$ bit counted from left to right of d is 1, then the $i^{th}$ bit of the output signal is 1; if the $j^{th}$ bit counted from left to right of d is 0, then the $i^{th}$ bit of the output signal is 0;

S04, determining whether the value of the counter reaches an upper limit, if yes, then ending, otherwise proceeding to step S05;

S05, adding the value i of the counter by 1, and turning to step S02.

In step S02, searching for the rightmost 1 is obtained by a loop test from left to right or from right to left;
in the step S03, determining whether the corresponding bits are equal is specifically as follows. d is shifted j−1 bits to the left by a shift instruction and a highest bit is retained, if a result is 1, then the corresponding bits are equal, if the result is 0, then the corresponding bits are not equal; or d is shifted n−j bits to the right by the shift instruction and a lowest bit is retained, if a result is 1, then the corresponding bits are equal, if the result is 0, then the corresponding bits are not equal.

For example, d is 0110, i is 0100, then j is 3, and then d is shifted 3−1 bits to the left, and turns into 1000, the highest bit is retained, if it is 1, then the $(i+1)^{th}$ bit outputs 1. It is also possible to shift d by n−j bits to the right to turn into 0011, and then the lowest bit is retained, if it is 1 then the $(i+1)^{th}$ bit outputs 1, and if it is 0 then the $(i+1)^{th}$ bit outputs 0. The rest of the contents are the same as that in embodiment 1.

Embodiment 3: a pulse density modulation method of the present embodiment includes the following steps of:
S01, obtaining a number of bits n of a binary density value d, setting a number of bits of a counter as n, wherein an initial value of the counter is 0 or 1;
S02, searching for the rightmost 1 and determining whether corresponding bits are equal;
S03, determining whether the value of the counter reaches an upper limit, if yes, then ending, otherwise proceeding to step S04;
S04, adding the value i of the counter by 1, and turning to the step S02.

The step S02 is specifically as follows.
S11, the density value d is inverted in bit sequence to obtain D; the inversion in bit sequence herein means putting the original $1^{st}$ bit to the last bit, the original $2^{nd}$ bit to the penultimate bit, and so on; d is set to 0011, the obtained D is 1100; n is 4, and i is set to 0100;
S12, the count value i is subtracted by one, and then XORed with the original i to obtain k; when i is 0, the $(i+1)^{th}$ bit of the output signal is set as 0 or 1; 0100−1=0011, 0011 is XORed with 0100 to obtain 0111;
S13, k is added by 1, and then shift one bit to the right to obtain m; 0111+1=1000, and shift one bit to the right to obtain 0100;
S14, an AND operation is performed on m and D, if the result is equal to m, then the $(i+1)^{th}$ bit of the output signal is 1; if the result is not equal to m, then the $(i+1)^{th}$ bit of the output signal is 0. An AND operation is performed on 0100 and 1100, 0100 is obtained, the same as m, the $0101^{th}$ (5 in decimal) bit of the output signal outputs 1.

For another example, if d is 0001, i is 1000, then D is 1000, i−1 is 0111, and 0111 is XORed with 1000 to obtain k as 1111, k+1=10000, and shift one bit to the right to obtain m as 1000. The AND operation is performed on 1000 and 1000 to obtain 1000, which is equal to m, and the $9^{th}$ bit of the output signal is 1.

The rest of the contents are the same as that in embodiment 1.

Embodiment 4: a pulse density modulation method, wherein the period of the pulse signal is s, and the $q^{th}$ bit of the output signal is determined by the following manner:
A01, a density value d is multiplied by a density value q, an obtained product is divided by s, and an integer part taken from an obtained quotient is h;
A02, whether h and a pulse count value are the same is determined, if the same, then the $q^{th}$ bit of the output signal is 0, if not, then proceed to the step A03;
A03, the $q^{th}$ bit of the output signal is set to 1, and the pulse count value is set to h; the number of bits of the output signal is s, i.e., a value range of q is 1 to s; an initial value of the pulse count value is 0.

For example, s is 16, d is 3, the initial value of the pulse counter is 0, the $1^{st}$ bit to the $5^{th}$ bit of the output signal, 3×q/16, the integer part is 0, which is equal to the value of the pulse counter, and the output is 0; the $6^{th}$ bit, the integer part of 3×q/16 is 1, which is not equal to the value of the pulse counter, the output is 1, and the value of the pulse counter is set to 1; the $7^{th}$-$10^{th}$ bits of the output signal all output 0; the $11^{th}$ bit, the integer part of 3×q/16 is 2, which is not equal to the value of the pulse counter, the output is 1, and the value of the pulse counter is set to 2; and so on.

If the number of bits of the output signal is recorded from 0 to $2^n-1$, i.e. s is still $2^n$, then the value of q is 0 to $2^n-1$, and the formula becomes d×q/(s−1), and the other steps are the same. If s is not a power of 2 in a system, it can be considered as taking a part of the integrated version, and the retained part is handled in the same way as described above.

In the present solution, the number of bits of the output signal begins from the $1^{st}$ bit, and in actual programming, it tends to begin from the 0 bit, which is a conventional translation and still falls within the scope defined by the claims of the present application. Similarly, density ranges of 0 to $(2^n-1)$ and 0 to $2^n$ also fall within the scope defined by the claims.

Figure 2:
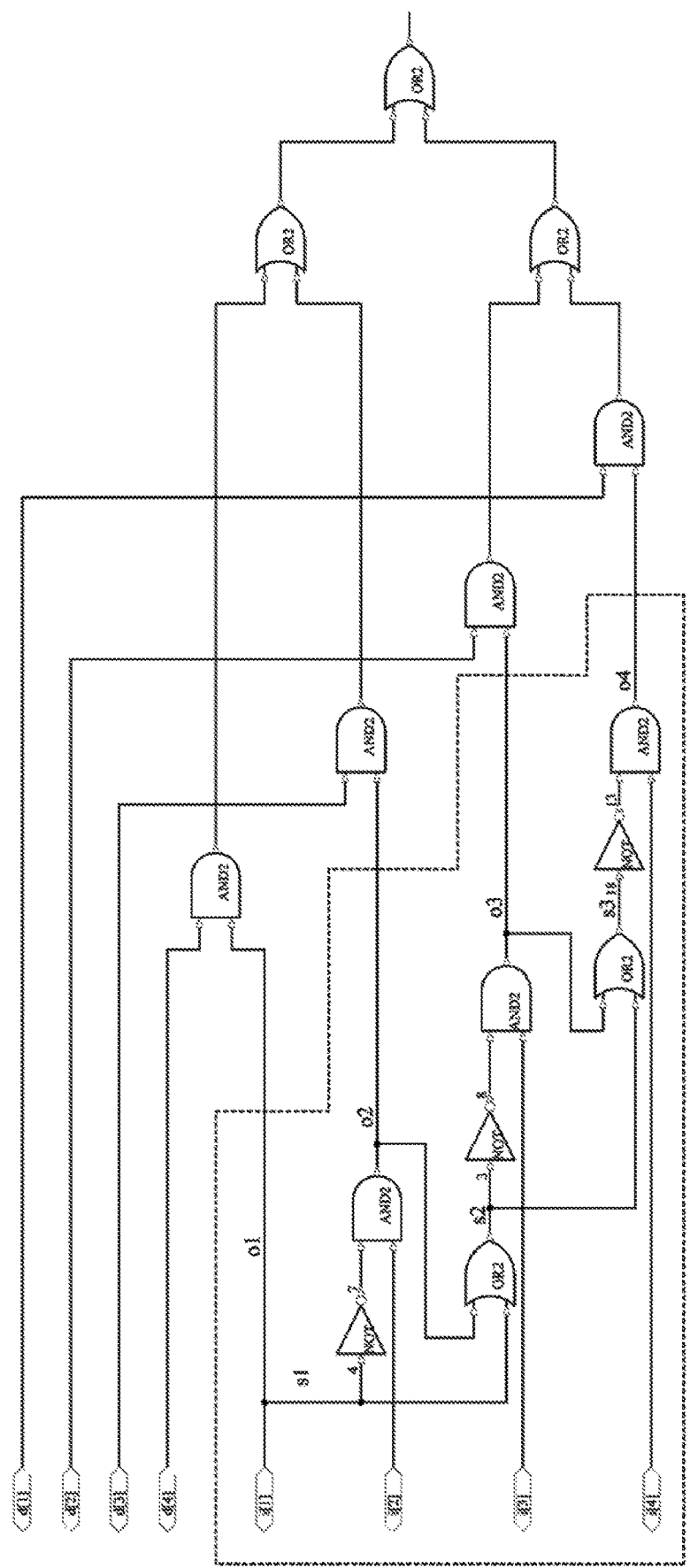
FIG. 2 is a first circuit diagram of the present disclosure.

Embodiment 5: a pulse density value signal conversion circuit, as shown in FIG. 2, includes a search module and a comparison module, and the search module includes a low-bit test module and a conversion module, an input terminal of the low-bit test module is connected to a counter, an output terminal of the low-bit test module is connected to the conversion module, and an output terminal of the conversion module is connected to an input terminal of the comparison module, the input terminal of the comparison module is further connected to a pulse density value signal, and an output terminal of the comparison module is an output terminal of the pulse density value signal conversion circuit; the low-bit test module includes n−1 signal lines, n count input terminals and n−2 OR gates, and the conversion module includes n−1 AND gates, n−1 NOT gates and n output terminals, wherein n is the number of bits of the counter, the signal lines are marked as s[1] to s[n−1] in sequence, the count input terminals are marked as i[1] to i[n] in sequence and are respectively connected to the $1^{st}$ bit to $n^{th}$ bit of the counter, and the output terminals are marked as o[1] to o[n] in sequence;
the count input terminal i[1] is directly connected to the output terminal o[1] and the signal line s[1], the signal line s[1] is connected to a first input terminal of a first AND gate through a NOT gate, a second input terminal of the first AND gate is connected to the count input terminal i[2], and an output terminal of the first AND gate is connected to the output terminal o[2];
when j≥2, an output terminal of the $(j−1)^{th}$ OR gate is connected to the signal line s[j], the signal line s[j] is connected to a first input terminal of the $j^{th}$ AND gate through a NOT gate, a second input terminal of the $j^{th}$ AND gate is connected to the count input terminal i[j+1]; a first input terminal of the $(j−1)^{th}$ OR gate is connected to the output terminal o[j], and a second input terminal of the $(j−1)^{th}$ OR gate is connected to the signal line s[j−1].

The comparison module includes n pulse density value input terminals, n AND gates, and an OR gate having n input terminals, the pulse density value input terminals are marked as d[1] to d[n] in sequence and are respectively connected to the $1^{st}$ bit to the $n^{th}$ bit of the pulse density value signal; a first input terminal of the $k^{th}$ AND gate is connected to the output terminal o[k] of the search module, a second input terminal of the $k^{th}$ AND gate is connected to the input terminal d[n+1−k] of the pulse density value, an output terminal of the $k^{th}$ AND gate is connected to the $k^{th}$ input terminal of the OR gate having n input terminals; an output of the OR gate having n input terminals is a total output terminal of the pulse signal conversion circuit. The OR gate having n input terminals can be implemented by stacking a number of 2 input terminals OR gates.

The function of the search module is to find the position of the lowest-bit 1 of the counter i, and then zero clearing is performed on all except the bit; the low-bit test module detects whether there is 1 on each bit lower than it, and the output of the OR gate is caused by the conversion module to pass through the NOT gate and is input to the AND gate together with i to obtain the output o, and the output signal is finally obtained by using the comparison module.

Figure 3:
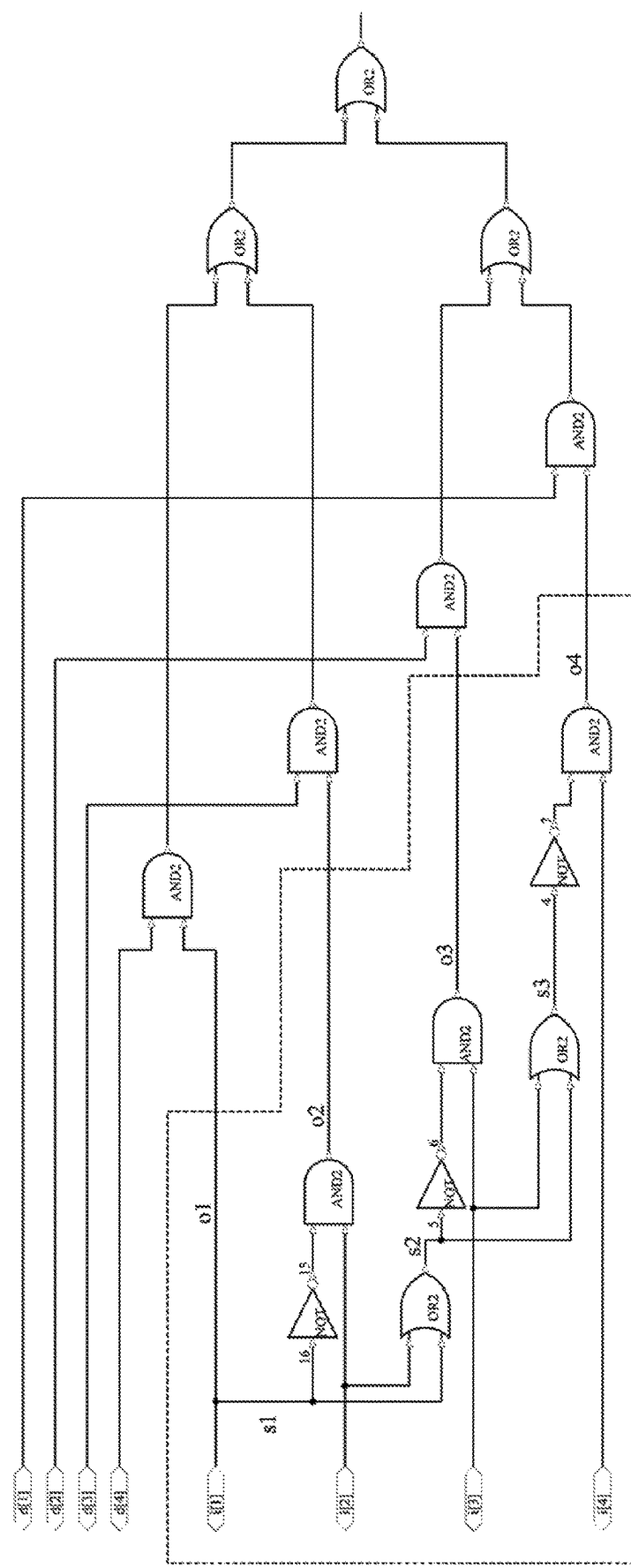
FIG. 3 is a second circuit diagram of the present disclosure.

Embodiment 6: a pulse density value signal conversion circuit, as shown in FIG. 3, includes a search module and a comparison module, and the search module includes a low-bit test module and a conversion module, an input terminal of the low-bit test module is connected to a counter, an output terminal of the low-bit test module is connected to the conversion module, and an output terminal of the conversion module is connected to an input terminal of the comparison module, the input terminal of the comparison module is further connected to a pulse density value signal, and an output terminal of the comparison module is an output terminal of the pulse density value signal conversion circuit; the low-bit test module includes n−1 signal lines, n count input terminals and n−2 OR gates, and the conversion module includes n−1 AND gates, n−1 NOT gates and n output terminals, wherein n is the number of bits of the counter, the signal lines are marked as s[1] to s[n−1] in sequence, the count input terminals are marked as i[1] to i[n] in sequence and are respectively connected to the $1^{st}$ to $n^{th}$ bits of the counter, and the output terminals are marked as o[1] to o[n] in sequence;

the count input terminal i[1] is directly connected to the output terminal o[1] and the signal line s[1], the signal line s[1] is connected to a first input terminal of a first AND gate through a NOT gate, a second input terminal of the first AND gate is connected to the count input terminal i[2], and an output terminal of the first AND gate is connected to the output terminal o[2];

when j≥2, an output terminal of the $(j-1)^{th}$ OR gate is connected to the signal line s[j], the signal line s[j] is connected to a first input terminal of the $j^{th}$ AND gate through a NOT gate, a second input terminal of the $j^{th}$ AND gate is connected to the count input terminal i[j+1]; a first input terminal of the $(j-1)^{th}$ OR gate is connected to the count output terminal i[j], and a second input terminal of the $(j-1)^{th}$ OR gate is connected to the signal line s[j−1].

The structure of the comparison module is the same as that of the embodiment 1. The function of each module is the same as that of the embodiment 5.

Figure 4:
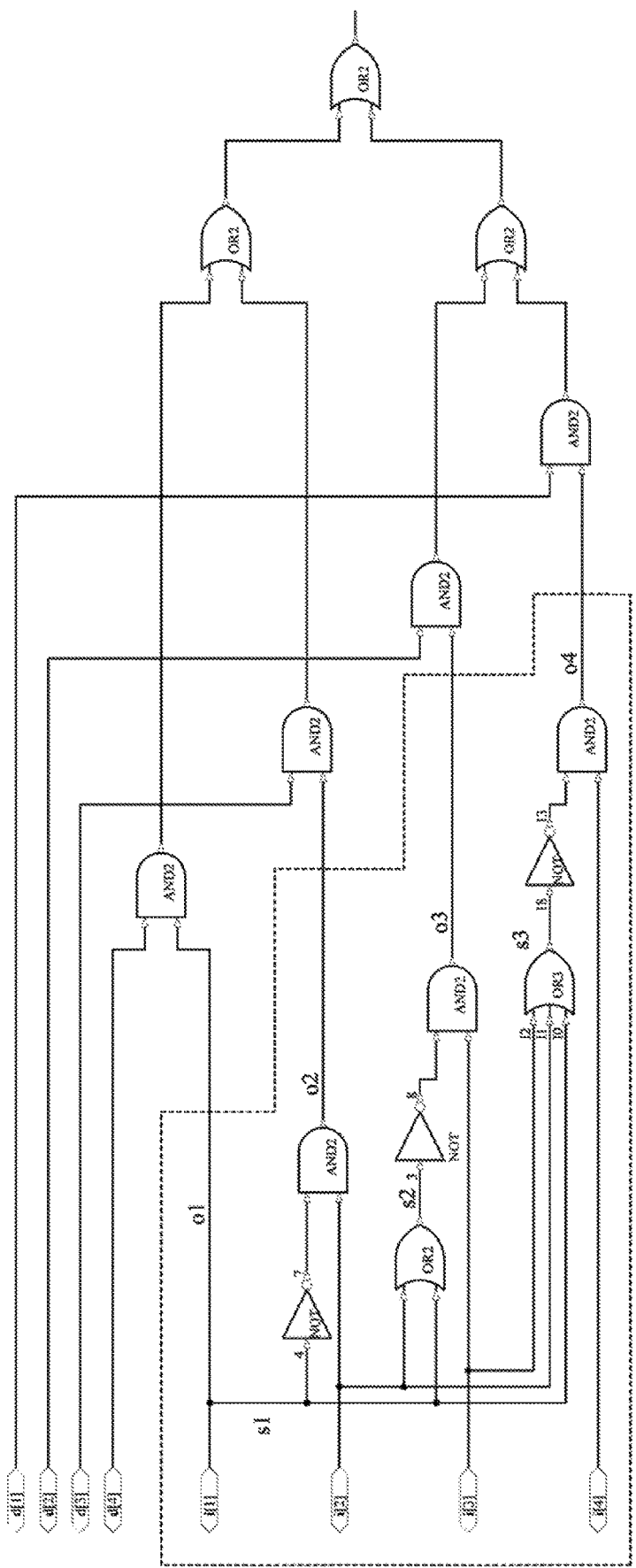
FIG. 4 is a third circuit diagram of the present disclosure.

Embodiment 7: a pulse density value signal conversion circuit, as shown in FIG. 4, includes a search module and a comparison module, and the search module includes a low-bit test module and a conversion module, an input terminal of the low-bit test module is connected to a counter, an output terminal of the low-bit test module is connected to the conversion module, and an output terminal of the conversion module is connected to an input terminal of the comparison module, the input terminal of the comparison module is further connected to a pulse density value signal, and an output terminal of the comparison module is an output terminal of the pulse density value signal conversion circuit; the low-bit test module includes n−1 signal lines, n count input terminals and n−2 OR gates, and the conversion module includes n−1 AND gates, n−1 NOT gates and n output terminals, wherein n is the number of bits of the counter, the signal lines are marked as s[1] to s[n−1] in sequence, the count input terminals are marked as i[1] to i[n] in sequence and are respectively connected to the $1^{st}$ to $n^{th}$ bits of the counter, and the output terminals are marked as o[1] to o[n] in sequence; the $j^{th}$ OR gate has j+1 input terminals; the count input terminal i[1] is directly connected to the output terminal o[1] and the signal line s[1], the signal line s[1] is connected to a first input terminal of a first AND gate through a NOT gate, a second input terminal of the first AND gate is connected to the count input terminal i[2], and an output terminal of the first AND gate is connected to the output terminal o[2]; when j≥2, an output terminal of the $(j-1)^{th}$ OR gate is connected to the signal line s[j], the signal line s[j] is connected to a first input terminal of the $j^{th}$ AND gate through a NOT gate, a second input terminal of the $j^{th}$ AND gate is connected to the count input terminal i[j+1]; the $g^{th}$ input terminal of the $(j-1)^{th}$ OR gate is connected to the count input terminal i[g].

The structure of the comparison module is the same as that of the embodiment 1. The function of each module is the same as that of the embodiment 5.

The present solution is used for converting a pulse density value signal to obtain a pulse density value signal with a preferable uniformity. The input of the present solution is a binary signal representing the pulse density value, and the output is a pulse signal after a density modulation, the current converted sequence number is stored in the counter, and the sequence number is added by 1 for each conversion.

The specific embodiments described herein are merely illustrative to the spirit of the present disclosure. The persons skilled in the art can make various modifications or supplements to the specific embodiments described or make substitutions in a similar manner, without departing from the spirit of the present disclosure or exceeding the scope defined by the appended claims.

Although the terminologies including counter, number of bits, gate circuit and the like are used more often herein, the possibility of using other terminologies is not excluded. These terminologies are only intended to describe and illustrate the essence of the present disclosure more conveniently; illustrating them as any additional limit is disobedient with the spirit of the present disclosure.

What is claimed is:

1. A pulse density modulation method, comprising the following steps:
   S01, obtaining a number of bits n of a binary density value d, wherein a number of bits of a counter is set as n, an initial value of the counter is 0 or 1;
   S02, searching for a rightmost 1: obtaining a number of bits j of the rightmost 1 of a current value i of the counter counted from right to left;
   S03, determining whether corresponding bits are equal wherein if a $j^{th}$ bit counted from left to right of the binary density value d is 1, then a bit of a signal output in a period is 1; if the $j^{th}$ bit counted from left to right of the binary density value d is 0, then the bit of the signal output in the period is 0;
   S04, adding the current value i of the counter by 1, proceeding to a next period, and turning to the S02.

2. The pulse density modulation method according to claim 1, wherein in the S02, an instruction in a CPU instruction set is configured to directly search and obtain the number of bits j of the rightmost 1 of the current value i of the counter counted from right to left; and in the S03, a bit test instruction is configured to check whether the $j^{th}$ bit counted from left to right of the binary density value d is 1.

3. The pulse density modulation method according to claim 1, wherein in the S02, searching for the rightmost 1 is realized by a loop test from left to right or a loop test from right to left; and in the S03, the binary density value d is shifted j−1 bits to the left by a first shift instruction and a highest bit is retained, if a first result is 1, then the corresponding bits are equal, if the first result is 0, then the corresponding bits are not equal; or the binary density value d is shifted n−j bits to the right by a second shift instruction and a lowest bit is retained, if a second result is 1, then the corresponding bits are equal, if the second result is 0, then the corresponding bits are not equal.

4. The pulse density modulation method according to claim 1, wherein the S02 and the S03 are replaced by S11-S14 as follows:

S11, inverting the binary density value d according to a bit sequence to obtain D;

S12, subtracting the current value i of the counter by one, and then performing an exclusive-OR (XOR) with an original i to obtain k;

S13, adding k by 1, and shifting one bit to the right to obtain m; and

S14, performing an AND operation on m and D, wherein if a result is equal to m, then the bit of the signal output in the period is 1; if the result is not equal to m, the bit of the signal output in the period is 0.

5. The pulse density modulation method according to claim 1, wherein when the initial value of the counter is 0, a first bit of an output signal is set to 0 or 1.

6. A pulse density modulation method, wherein a period of a pulse signal is s, and a $q^{th}$ bit of an output signal is determined by the following steps:

A01, multiplying a density value d with a density value q to obtain a product, dividing the product by s to obtain a quotient, and taking an integer part from the quotient as h;

A02, determining whether h and a pulse count value are the same, wherein if h and the pulse count value are the same, the $q^{th}$ bit of the output signal is 0, if not, proceed to the A03; and A03, setting the CO bit of the output signal as 1, and setting the pulse count value as h;

wherein a number of bits of the output signal is s, a value range of q is 1 to s, an initial value of the pulse count value is 0.

7. A pulse density value signal conversion circuit, comprising a search module and a comparison module, wherein the search module comprises a low-bit test module and a conversion module, an input terminal of the low-bit test module is connected to a counter, an output terminal of the low-bit test module is connected to the conversion module, and an output terminal of the conversion module is connected to an input terminal of the comparison module, the input terminal of the comparison module is further connected to a pulse density value signal, and an output terminal of the comparison module is an output terminal of the pulse density value signal conversion circuit; the low-bit test module comprises n−1 signal lines, n count input terminals and n−2 OR gates, and the conversion module comprises n−1 AND gates, n−1 NOT gates and n output terminals, wherein n is a number of bits of the counter, the n−1 signal lines are marked as s[1] to s[n−1] in sequence, the n count input terminals are marked as i[1] to i[n] in sequence and are respectively connected to $1^{st}$ to $n^{th}$ bits of the counter, and the n output terminals are marked as o[1] to o[n] in sequence;

the count input terminal i[1] is directly connected to the output terminal o[1] and the signal line s [1], the signal line s [1] is connected to a first input terminal of a first AND gate through a NOT gate, a second input terminal of the first AND gate is connected to the count input terminal i[2], and an output terminal of the first AND gate is connected to the output terminal o[2];

when j≥2, an output terminal of the $(j-1)^{th}$ OR gate is connected to the signal line s[j], the signal line s[j] is connected to a first input terminal of the $j^{th}$ AND gate through the NOT gate, a second input terminal of the $j^{th}$ AND gate is connected to the count input terminal i[j+1]; a first input terminal of the $(j-1)^{th}$ OR gate is connected to the output terminal o[j], and a second input terminal of the $(j-1)^{th}$ OR gate is connected to the signal line s[j−1].

8. The pulse density value signal conversion circuit according to claim 7, wherein the comparison module comprises n pulse density value input terminals, n AND gates, and an OR gate having n input terminals, the pulse density value input terminals are marked as d[1] to d[n] in sequence and are respectively connected to $1^{st}$ to $n^{th}$ bits of the pulse density value signal;

a first input terminal of the k' AND gate is connected to the output terminal o[k] of the search module, a second input terminal of the $k^{th}$ AND gate is connected to the pulse density value input terminal d[n+1−k], an output terminal of the $k^{th}$ AND gate is connected to the $k^{th}$ input terminal of the OR gate having n input terminals; an output of the OR gate having n input terminals is a total output terminal of the pulse density value signal conversion circuit.

9. A pulse density value signal conversion circuit, comprising a search module and a comparison module, wherein the search module comprises a low-bit test module and a conversion module, an input terminal of the low-bit test module is connected to a counter, an output terminal of the low-bit test module is connected to the conversion module, and an output terminal of the conversion module is connected to an input terminal of the comparison module, the input terminal of the comparison module is further connected to a pulse density value signal, and an output terminal of the comparison module is an output terminal of the pulse density value signal conversion circuit; the low-bit test module comprises n−1 signal lines, n count input terminals and n−2 OR gates, and the conversion module comprises n−1 AND gates, n−1 NOT gates and n output terminals, wherein n is the number of bits of the counter, the n−1 signal lines are marked as s[1] to s[n−1] in sequence, the n count input terminals are marked as i[1] to i[n] in sequence and are respectively connected to $1^{st}$ to $n^{th}$ bits of the counter, and the n output terminals are marked as o[1] to o[n] in sequence;

the count input terminal i[1] is directly connected to the output terminal o[1] and the signal line s[1], the signal line s[1] is connected to a first input terminal of a first AND gate through a NOT gate, a second input terminal of the first AND gate is connected to the count input terminal i[2], and an output terminal of the first AND gate is connected to the output terminal o[2];

when j≥2, an output terminal of the (j−1)$^{th}$ OR gate is connected to the signal line s[j], the signal line s[j] is connected to a first input terminal of the j$^{th}$ AND gate through the NOT gate, a second input terminal of the j$^{th}$ AND gate is connected to the count input terminal i[j+1]; a first input terminal of the (j−1)$^{th}$ OR gate is connected to the count output terminal i[j], and a second input terminal of the (j−1)$^{th}$ OR gate is connected to the signal line s[j−1].

10. The pulse density value signal conversion circuit according to claim 9, wherein the comparison module comprises n pulse density value input terminals, n AND gates, and an OR gate having n input terminals, the n pulse density value input terminals are marked as d[1] to d[n] in sequence and are respectively connected to 1$^{st}$ to n$^{th}$ bits of the pulse density value signal;

a first input terminal of the k' AND gate is connected to the output terminal o[k] of the search module, a second input terminal of the k$^{th}$ AND gate is connected to the pulse density value input terminal d[n+1−k], an output terminal of the k$^{th}$ AND gate is connected to the k$^{th}$ input terminal of the OR gate having n input terminals; an output of the OR gate having n input terminals is a total output of the pulse density value signal conversion circuit.

11. A pulse density value signal conversion circuit, comprising a search module and a comparison module, wherein the search module comprises a low-bit test module and a conversion module, an input terminal of the low-bit test module is connected to a counter, an output terminal of the low-bit test module is connected to the conversion module, and an output terminal of the conversion module is connected to an input terminal of the comparison module, the input terminal of the comparison module is further connected to a pulse density value signal, and an output terminal of the comparison module is an output terminal of the pulse density value signal conversion circuit; the low-bit test module comprises n−1 signal lines, n count input terminals and n−2 OR gates, and the conversion module comprises n−1 AND gates, n−1 NOT gates and n output terminals, wherein n is the number of bits of the counter, the n−1 signal lines are marked as s[1] to s[n−1] in sequence, the n count input terminals are marked as i[1] to i[n] in sequence and are respectively connected to 1$^{st}$ to n$^{th}$ bits of the counter, and the n output terminals are marked as o[1] to o[n] in sequence; the j$^{th}$ OR gate has j+1 input terminals;

the count input terminal i[1] is directly connected to the output terminal o[1] and the signal line s[1], the signal line s[1] is connected to a first input terminal of a first AND gate through a NOT gate, a second input terminal of the first AND gate is connected to the count input terminal i[2], and an output terminal of the first AND gate is connected to the output terminal o[2];

when j≥2, an output terminal of the (j−1)$^{th}$ OR gate is connected to the signal line s[j], the signal line s[j] is connected to a first input terminal of the j$^{th}$ AND gate through the NOT gate, a second input terminal of the j$^{th}$ AND gate is connected to the count input terminal i[j+1]; the g$^{th}$ input terminal of the (j−1)$^{th}$ OR gate is connected to the count input terminal i[g].

12. The pulse density value signal conversion circuit according to claim 11, wherein the comparison module comprises n pulse density value input terminals, n AND gates, and an OR gate having n input terminals, the n pulse density value input terminals are marked as d[1] to d[n] in sequence and respectively connected to 1$^{st}$ to n$^{th}$ bits of the pulse signal density value;

a first input terminal of the k$^{th}$ AND gate is connected to the output terminal o[k] of the search module, a second input terminal of the k$^{th}$ AND gate is connected to the signal input terminal d[n+1−k], an output terminal of the k$^{th}$ AND gate is connected to the k$^{th}$ input terminal of the OR gate having n input terminals; an output of the OR gate having n input terminals is a total output terminal of the pulse density value signal conversion circuit.

* * * * *